(12) United States Patent
Kimba (10) Patent No.: US 7,964,844 B2
(45) Date of Patent: Jun. 21, 2011

(54) SAMPLE INSPECTION APPARATUS (75) Inventor: Toshifumi Kimba, Tokyo (JP)

(73) Assignee: Ebara Corporation, Tokyo (JP)

( * ) Notice: Subject to any disclaimer, the term of this patent is extended or adjusted under 35 U.S.C. 154(b) by 472 days.

(21) Appl. No.: 11/913,387

(22) PCT Filed: Apr. 27, 2006

(86) PCT No.: PCT/JP2006/308843
§ 371 (c)(1),
(2), (4) Date: Jan. 6, 2009

(87) PCT Pub. No.: WO2006/120917
PCT Pub. Date: Nov. 16, 2006

(65) Prior Publication Data
US 2009/0212214 A1   Aug. 27, 2009

(30) Foreign Application Priority Data
May 2, 2005 (JP) ................... 2005-134136

(51) Int. Cl.
*H01J 37/21* (2006.01)
*H01J 37/00* (2006.01)

(52) U.S. Cl. ......... 250/310; 250/305; 250/307; 250/309

(58) Field of Classification Search ............ 250/305, 250/306, 307, 309, 310
See application file for complete search history.

(56) References Cited

U.S. PATENT DOCUMENTS

| | | | |
|---|---|---|---|
| 4,097,740 A * | 6/1978 | Muller et al. | 250/311 |
| 6,621,082 B2 * | 9/2003 | Morita et al. | 850/5 |
| 6,753,518 B2 * | 6/2004 | Watanabe et al. | 250/201.3 |
| 6,888,918 B2 * | 5/2005 | Horai et al. | 378/58 |
| 6,919,577 B2 * | 7/2005 | Watanabe et al. | 250/559.4 |
| 7,248,353 B2 | 7/2007 | Kimba et al. | |
| 7,440,086 B2 * | 10/2008 | Borowicz et al. | 356/72 |
| 2003/0006372 A1 | 1/2003 | Morita et al. | |
| 2004/0211899 A1 | 10/2004 | Ezumi et al. | |

FOREIGN PATENT DOCUMENTS

| | | |
|---|---|---|
| JP | 53013 A | 1/1993 |
| JP | 7245075 A | 9/1995 |
| JP | 1048163 A | 2/1998 |
| JP | 2000228166 A | 5/2000 |
| JP | 20037243 A | 1/2003 |
| WO | 03007330 A1 | 1/2003 |

OTHER PUBLICATIONS

International Search Report of PCT/JP2006/308843, date of mailing Aug. 8, 2006.

\* cited by examiner

*Primary Examiner* — David A Vanore
(74) *Attorney, Agent, or Firm* — Westerman, Hattori, Daniels & Adrian, LLP (57) ABSTRACT

The invention avoids charge up when creating a focus map for an electron beam apparatus for inspecting a sample. An autofocus (AF) control apparatus controls to drive an actuator for moving a focus lens of an optical microscope while acquiring a contrast signal from the optical microscope for each of focus measurement points on a surface of a sample under control of a PC device, to automatically focus on the surface of the sample. The control apparatus detects a focus value of the optical microscope corresponding to a position (height) of the sample surface in an optical axis direction. The PC device receives the detected focus value, and converts the focus value into a voltage to be applied to an electrostatic lens of the electron beam device during actual sample inspection, and stores the converted value.

3 Claims, 6 Drawing Sheets

SAMPLE INSPECTION APPARATUS

TECHNICAL FIELD

The present invention relates to a sample inspection apparatus, and more particularly, to a sample inspection apparatus for inspecting and the like of, for example, a structure and an electrical conduction state on a surface of a sample such as a semiconductor wafer using an electron beam device.

BACKGROUND ART

There has been known an electron beam apparatus for scanning with an electron beam(s), a surface of a semiconductor wafer which is a sample to be inspected, detecting secondary electrons emitted from the wafer, generating image data of the wafer surface based on obtained detection signals, and detecting matching or mismatching of images of dies on the wafer to detect a defect(s) on the wafer.

As one of electron beam apparatuses as above, an apparatus using a mapping projection type electro-optical system has been also known. In the mapping projection type electron beam apparatus, secondary electrons or reflection electrons which are emitted from a surface of a wafer by the irradiation of a primary electron beam, are magnified and imaged by a multi-stage lens system including an objective lens. Uniform irradiation of an electron beam can be made to a relatively large area on the sample surface, so the inspection can be performed in higher throughput than that of an SEM system.

In a prior electron beam apparatus, the following focusing method is employed.

An auto-focus map (AF-MAP) is created every time a wafer is loaded onto a stage of the electron beam apparatus. When the sample is to be inspected, a voltage applied to electrodes of an electrostatic lens for focusing, is adjusted based on stage coordinates and data of the AF-MAP. Therefore, even when a position on the wafer surface in an optical axis direction is fluctuant, image data can be obtained under a condition that focus is achieved at any time.

The creation of the AF-MAP is executed as follows, using a sample inspection electron beam apparatus as a focus detection device.

At first, measurement points are set on a wafer, and a stage on which the wafer is placed is moved to a position so that a measurement point locates below the focus detection device. Although it is preferred to detect a focus value at a regular measurement point (for example, a lower left point of each die) on the wafer, a focus value may be detected at intervals of n dies and appropriate complimentary processing is executed to obtain focus values for dies focus values of which have not been detected. Alternatively, focus values at a plurality of measurement points of each die may be detected. Also, a measurement point may be selected at random. After detecting the focus values for the measurement point, the best focus value for the measurement point is determined and stored.

The stage is moved again to a location so that a next measurement point locates below the focus detection device to detect focus values. Then, the best focus value for the next measurement point is determined from the measurement values and stored. Therefore, the best focus values are determined and stored for all measurement points to create the AF-MAP.

DISCLOSURE OF THE INVENTION

Problems to be Solved by the Invention

However, the above-mentioned AF-MAP creation method requires a relatively long time period. Further, there are cases where focus measurements for points result in fail. In such a case, it is necessary to perform measurement again or to rerun its complimentary processing, so it takes more time period.

In addition, since the AF-MAP is created using the electron beam, the wafer is charged up, so that actual sample inspection is adversely affected by the charge up.

As stated above, the conventional method of creating the AF-MAP using the electron beam apparatus which is used for the actual inspection and automatically controlling the focus of the electrostatic lens on the basis of values of the AF-MAP, has problems that it takes much time and the charge up occurs.

It is an object of the present invention to solve such problems of the prior art.

Means for Solving the Problems

To achieve the above mentioned object, a sample inspection apparatus according to a first aspect of the present invention comprises:
  an electron beam apparatus for irradiating an electron beam on a sample to inspect the sample;
  optical focus value detection means including an optical microscope, for detecting a first focus value of the optical microscope which corresponds to a position of a surface of the sample in an optical axis direction; and
  means for converting the detected first focus value into a second focus value which is used in the electron beam apparatus when the sample is inspected by the electron beam apparatus.

In the sample inspection apparatus according to the first aspect of the present invention, it is preferable that the optical focus value detecting means comprises auto-focus control means for automatically focusing the optical microscope on the surface of the sample and outputting the first focus value corresponding to a position of a focus lens in the optical axis direction of the optical microscope under it is a focused condition; and the converting means comprises means for receiving the first focus value from the auto-focus control means and converting the first focus value into the second focus value such that the second focus value corresponds to a voltage applied to a focus lens of the electron beam apparatus. Preferably, the sample inspection apparatus further comprises memory means for storing the second focus value obtained by the converting means, in association with coordinate of a point on the sample at which the first focus value is detected.

To achieve the above object, a sample inspection apparatus according to a second aspect of the present invention comprises:
  an electron beam apparatus for irradiating an electron beam on a sample to inspect the sample;
  an electrostatic capacitance sensor for detecting an electrostatic capacitance corresponding to a position of a surface of the sample in an optical axis direction; and
  converting means for converting the detected electrostatic capacitance into a focus value which is used in the electron beam apparatus when the sample is inspected by the electron beam apparatus.

In the sample inspection apparatus according to the second aspect, it is preferable that the focus value used in the electron beam device when the sample is inspected, comprises a voltage applied to a focus lens of the electron beam device. Further, it is preferable to comprise memory means for storing the focus value obtained by the converting means, in association with a coordinate of a point on the sample at which the electrostatic capacitance is detected.

To achieve the above mentioned object, a sample inspection apparatus according to a third aspect of the present invention comprises:

an electron beam apparatus for irradiating an electron beam on a sample to inspect the sample;

a surface potential sensor for detecting a surface potential corresponding to a position of a surface of the sample in an optical axis direction; and converting means for converting the detected surface potential into a focus value which is used in the electron beam apparatus when the sample is inspected by the electron beam apparatus.

In the sample inspection apparatus according to the third aspect of the present invention, it is preferable that the focus value used in the electron beam device when the sample is inspected, comprises a voltage applied to a focus lens of the electron beam device. Further, it is preferable to comprise memory means for storing the focus value obtained by the converting means, in association with a coordinate of a point on the sample at which the surface potential is detected.

EFFECTS OF THE INVENTION

According to the present invention, since the above structure is employed and the AF-MAP is created without using the electron beam, an advantage that the AF-MAP can be created in a relatively short time period and a problem of the charge up does not occur, can be derived.

BEST MODE FOR CARRYING OUT THE INVENTION

Figure 1:
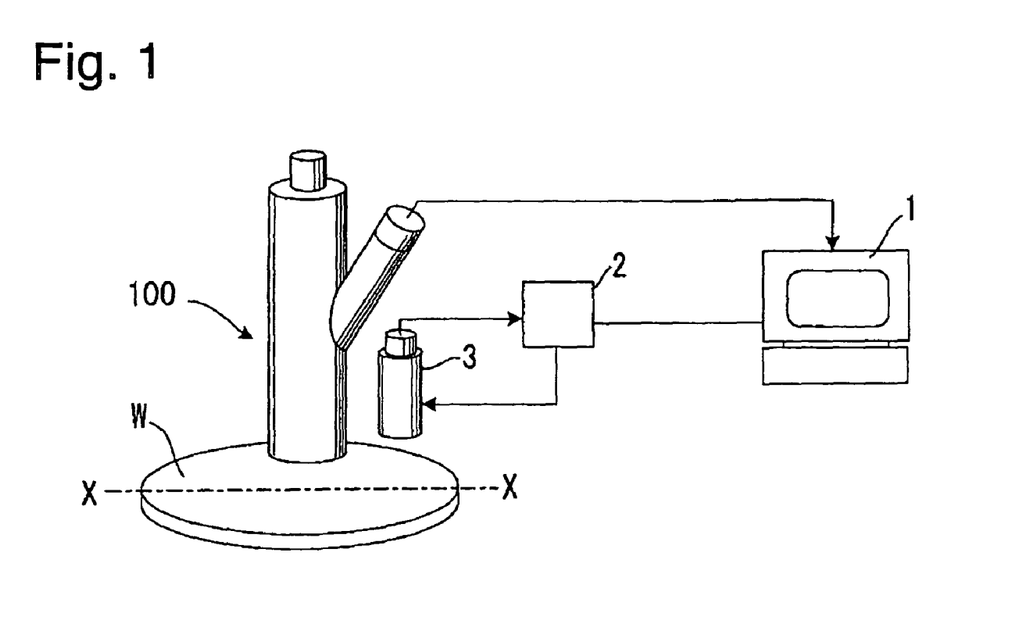
FIG. 1 is a perspective view illustrating a sample inspection apparatus according to a first embodiment of the present invention.
Figure 2:
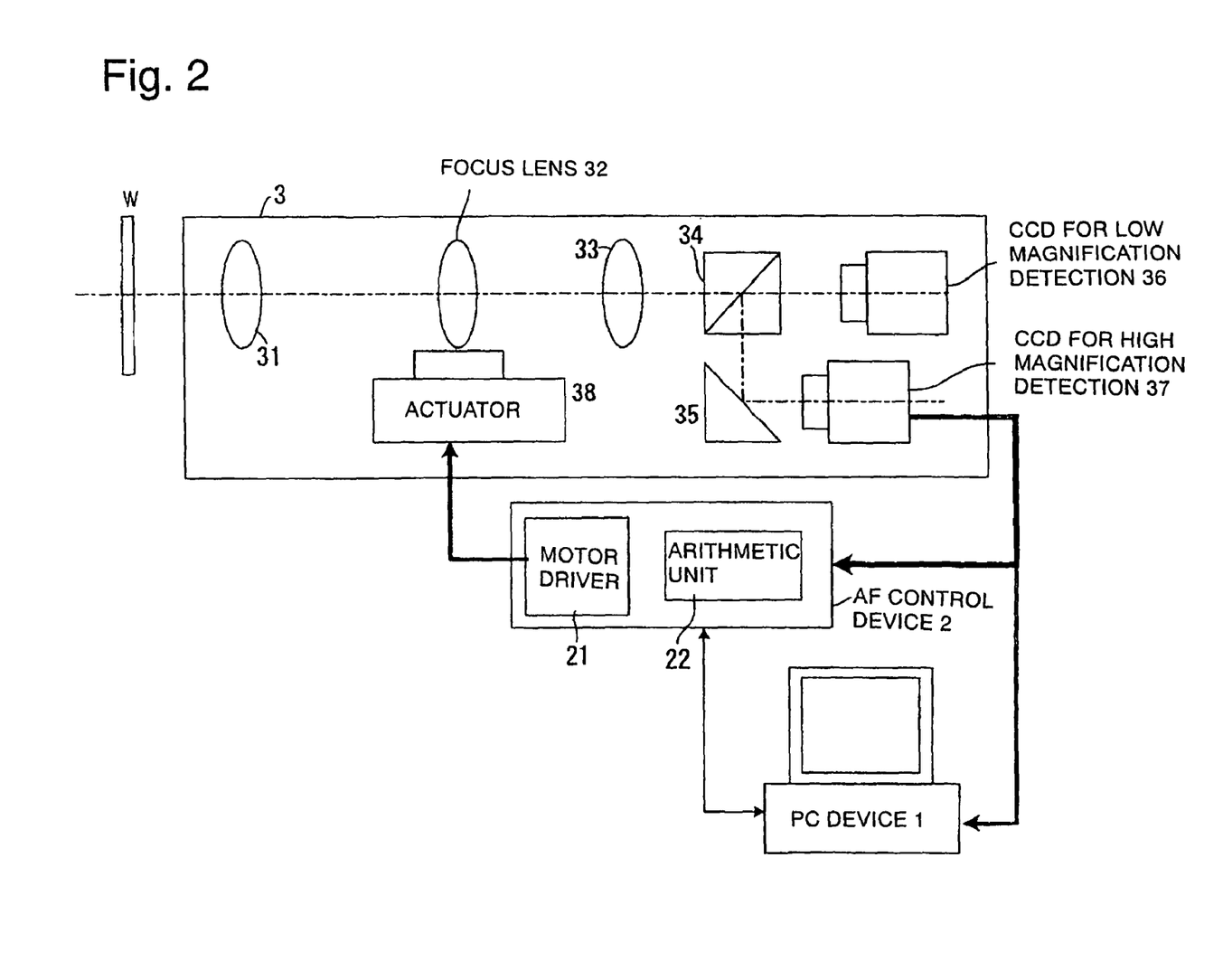
FIG. 2 is a block diagram illustrating a structure for creating a focus map using an optical microscope, in the sample inspection apparatus shown in FIG. 1.

FIG. 1 is a perspective view illustrating a sample inspection apparatus according to an embodiment of the present invention, and FIG. 2 is a block diagram illustrating an auto-focus map creation device which can be used in the sample inspection apparatus. In FIGS. 1 and 2, the reference numeral 100 denotes an electron beam apparatus for inspecting a sample W such as a semiconductor wafer to detect defects and the like on the wafer; 1 a PC device (or personal computer) including a monitor screen, for controlling an operation of the entire focus map creation device; 2 an auto-focus (AF) control device; and 3 an optical microscope. Image information at the time of inspection of the sample W is supplied from the electron beam apparatus 100 to the PC device 1.

Referring to FIG. 2, the optical microscope 3 comprises an objective lens 31, a focus lens 32, a magnifying lens 33, spectrum prisms 34 and 35, CCDs 36 and 37 for low magnification detection and high magnification detection, and an actuator 38.

The auto-focus control device 2 comprises a motor driver 21 and a procession or arithmetic unit 22 and has a function for outputting a motor driver signal based on a contrast signal from the CCD 36 or 37, controlling a motor (not shown) of the actuator 38 based on the motor driver signal to move the focus lens 32 in the optical axis direction, thereby performing automatic focusing. A commercial product can be employed as the auto-focus control device 2.

A flow for creating an auto-focus map (AF-MAP) using the focus map creation device shown in FIG. 2 will now be described. After wafer transfer including an alignment operation, recipes are created in which conditions and the like relating to an inspection are set. One of the recipes is an AF-MAP recipe. Auto-focusing is executed during an inspection operation and a review operation, on the basis of information on a created AF-MAP.

Figure 3:
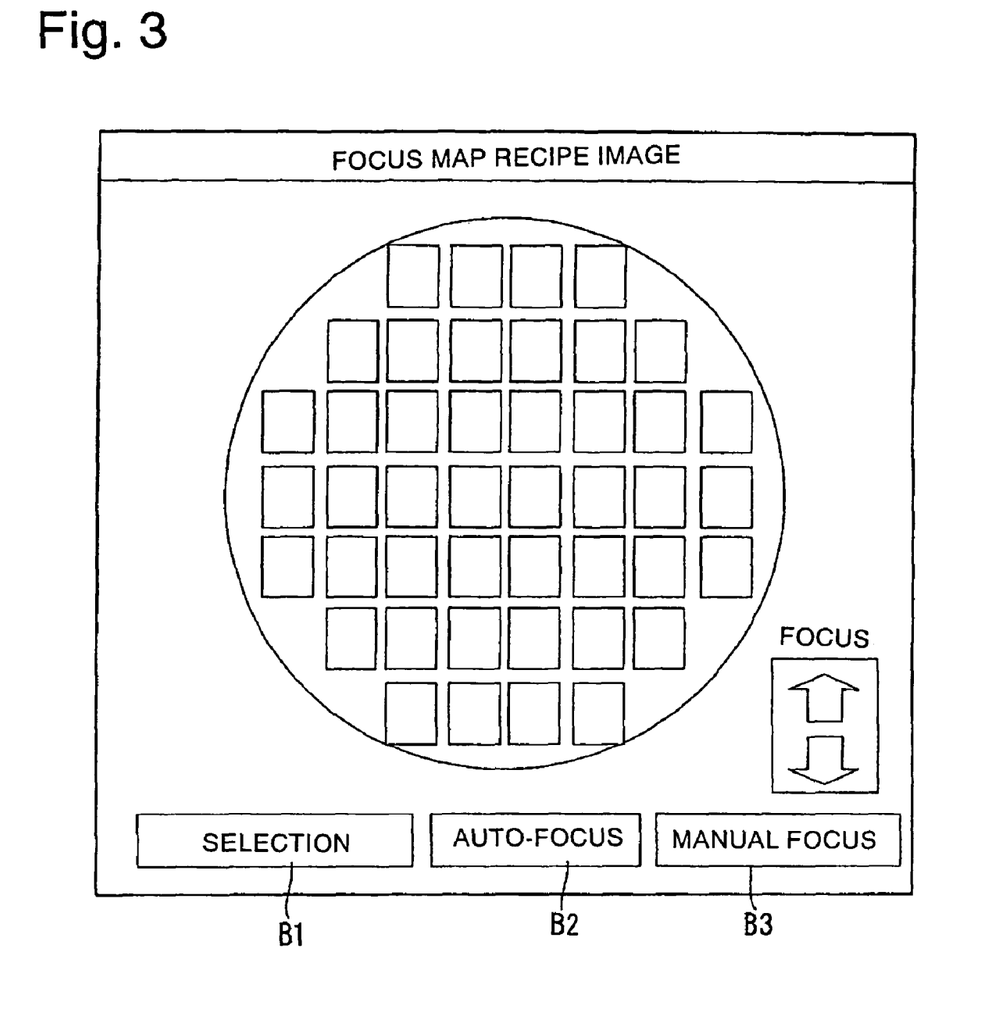
FIG. 3 illustrates a monitor screen of a PC device shown in FIG. 1, on which an operator can input data when an auto-focus map is to be created.

An input screen as shown in FIG. 3 is first displayed on the monitor of the PC device 1 by an operator, and then the following operation is performed on the screen.

a) A selection button B1 is manipulated to select a die a focus value (best focus value) for which is to be obtained.

b) A die pattern used in the case where the focus value is automatically measured is set. It is preferable to employ a pattern whose black and white contrast is relatively large as the set die pattern. A pattern in which a black and white pattern occurs periodically is not necessarily used.

c) The operator manipulates an auto-focus button B2.

Then, a mode for automatically determining a best focus value is selected and the focus map creation device shown in FIGS. 1 and 2 starts the operation. Best focus values at the positions of the die patterns which have been set at Step b), of the dies which have been set at Step a), are obtained. The best focus value is obtained for each measurement point.

At Step a), arbitrary dies can be specified by the operator. In addition, for example, all dies or arbitrary n dies can be selected. On the input screen, a schematic representation of a die arrangement within a wafer or a real image based on the wafer can be selected by the operator. When a manual focus button B3 is selected, the best focus value can be manually set using focus switches B4, a manipulation of which is linked to change a voltage value to be applied to focusing electrodes.

Step c) is executed by the arithmetic unit 22 of the auto-focus control device 2. A procedure for automatically determining the best focus value at each measurement point by the arithmetic unit 22 will be described with reference to FIG. 4.

Figure 4:
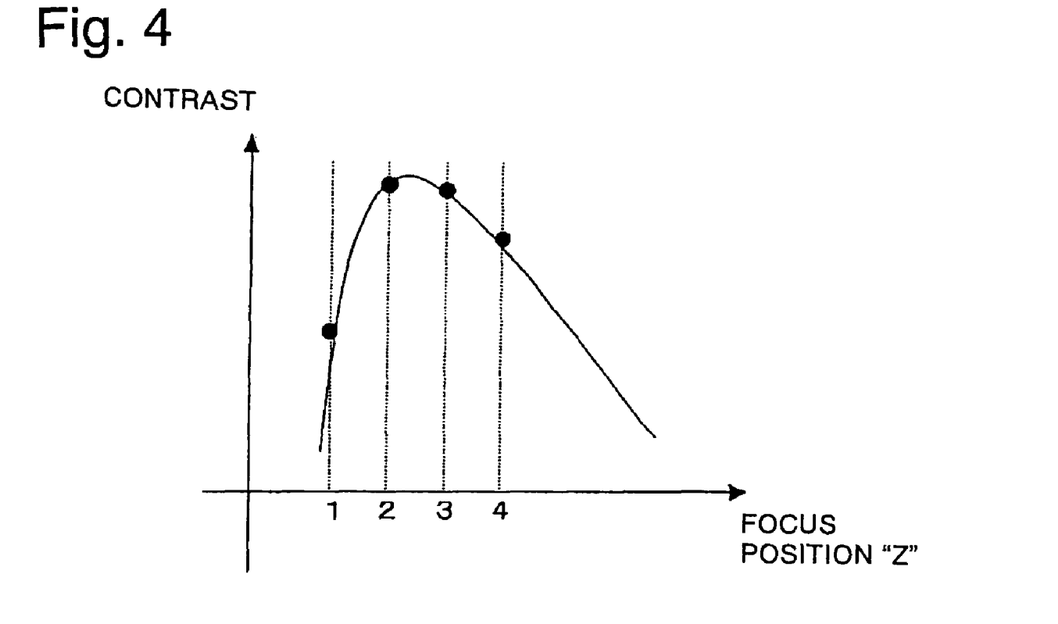
FIG. 4 is a diagram for explaining a method of determining a best focus value using the optical microscope according to the present invention.

1) Images at focus positions or focus values Z=1, 2, 3, and 4 are obtained to calculate contrasts thereof. The focus values indicate positions of the focus lens 32 on an optical axis (Z-axis).

2) A contrast function is obtained by a regression operation for the obtained contrast values.

3) A Z-value at which a contrast value on the contrast function is maximum, is obtained and set as a best focus value.

The best focus value corresponds a control position by the actuator 38, that is, it indicates the position of the focus lens 32 on the optical axis (Z-axis) at this point and is about 2.3 in the example of FIG. 4.

Figure 5:
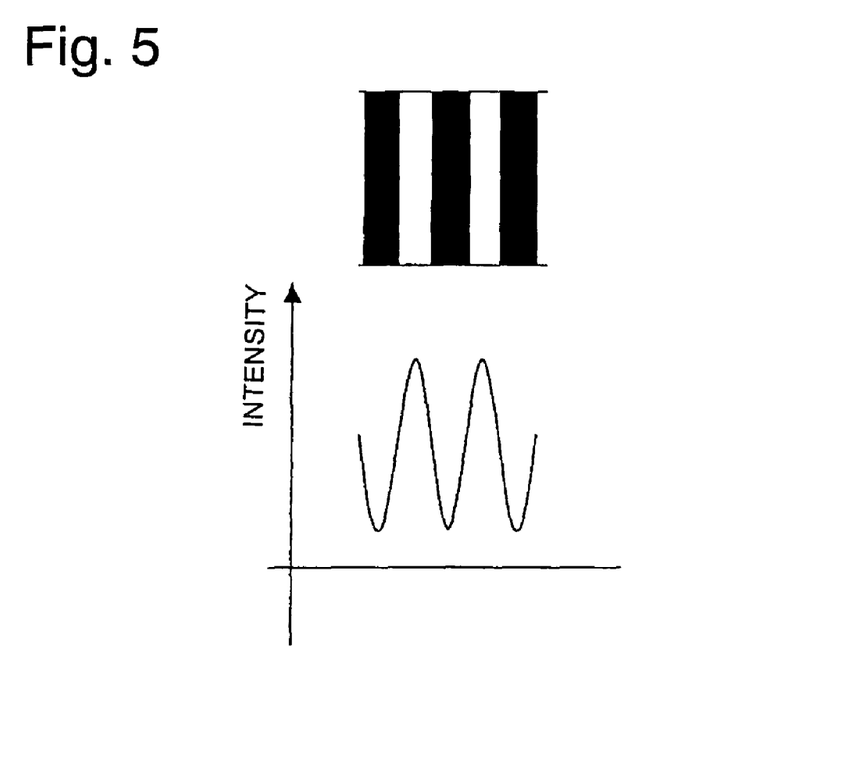
FIG. 5 illustrates a line-and-space pattern and image data (strength data) thereof, wherein the pattern is suitable to obtain the best focus value.

When a line-and-space pattern as shown in FIG. 5 is selected as a die pattern required for the case where focus values are automatically measured, a preferable result is obtained. When the black and white pattern is provided, a contrast can be measured without depending on a shape thereof.

The best focus values determined by the auto-focus control device 2 are transmitted to the PC device 1 and stored in combination with the position coordinates of the measurement points. Therefore, best focus values for all the measurement points are measured and stored.

As described above, the best focus value indicates the position of the focus lens 32 on the optical axis (Z-axis) at each measurement point. Therefore, the best focus value corresponds to the position in the Z-axis direction from the measurement position on the surface of the sample W.

Then, the PC device 1 converts the best focus value obtained at each measurement point into a voltage (best focus voltage value) to be applied to a focus lens (electrostatic lens) of the electron beam apparatus 100. Such conversion processing is executed as follows.

In the case of EB value (ZEB)=microscopic value (ZM) *coefficient (a)

Assuming that, regarding a certain measurement point, a best focus value (ZM) of the optical microscope shown in FIG. 1 and thus measured using the optical microscope is expressed by $ZM_1$ and a voltage (or best focus voltage value ZEB) applied to a focus lens of the electron beam apparatus 100 and thus measured using the apparatus, is expressed by $ZEB_1$. In this case, an expression for converting a measurement value $ZM_n$ obtained using the optical microscope for another measurement point "n" into $ZEB_n$ of the electron beam apparatus is expressed as follows:

$$ZEB_n = ZM_n * a \quad (1)$$

where "a"=$(ZEB_1/ZM_1)$

Therefore, the coefficient "a" is calculated from the measured best focus value $ZM_1$ and the best focus voltage value $ZEB_1$ for the certain measurement point. Accordingly, when the calculated coefficient "a" and the best focus value (position on the z-axis) $ZM_n$ obtained using the optical microscope are substituted into the expression (1), $ZEB_n$ for another measurement point can be obtained.

It is possible to use a plurality of measurement points to obtain the coefficient "a" of the expression (1). That is, an average of measured best focus voltage values for the points and an average of measured best focus values for the points are calculated, and the averages are substituted into $ZEM_1$ and $ZM_1$ in the above-mentioned expression to obtain the coefficient "a". In such a case, a more precise coefficient can be obtained.

In the case of EB value (ZEB)=coefficient (a)*microscopic value (ZM)+coefficient (b)

Assuming that, a best focus value measured for a certain first measurement point using the optical microscope shown in FIG. 1, and a voltage applied to the focus lens of the electron beam apparatus when obtaining the best focus value, which is measured in the electron beam device, are expressed by $ZM_1$ and $ZEB_1$, respectively. In addition, assuming that similar values (a best focus value and best focus voltage value) for a certain second measurement point are expressed by $ZM_2$ and $ZEB_2$, respectively. In this case, an expression for converting a measurement value $ZM_n$ obtained using the optical microscope for any other measurement point "n" into $ZEB_n$ of the electron beam device is expressed as follows:

$$ZEB_n = a * ZM_n + b \quad (2)$$

where a=$(ZEB_1-ZEB_2)/(ZM_1-ZM_2)$
b=$ZEB_1-(ZM_1*a)$

Therefore, when the coefficients "a" and "b" are calculated based on measurement values obtained for the first and second measurement points and then the calculated coefficients "a" and "b" and a measured best focus value $ZM_n$ for the measurement point "n" are substituted into the expression (2), $ZEB_n$ for the measurement point "n" can be obtained.

If higher-precision approximation can be caused by expressing ZEB using a polynomial of ZM, it is preferable to further increase the number of measurement positions and solve a hypercomplex polynomial to calculate coefficients.

In such a way, the PC device 1 calculates ZEB values based on best focus values (ZM values) measured using the optical microscope 3 and stores the obtained ZEB values in association with position coordinates of the respective measurement points. Thus, the AF-MAP for electron beam apparatus is created.

If necessary, a best focus value and a best focus voltage value for a point between two measurement points may be calculated by an interpolation method and stored in association with the XY-coordinate of the intermediate point.

Figure 6:
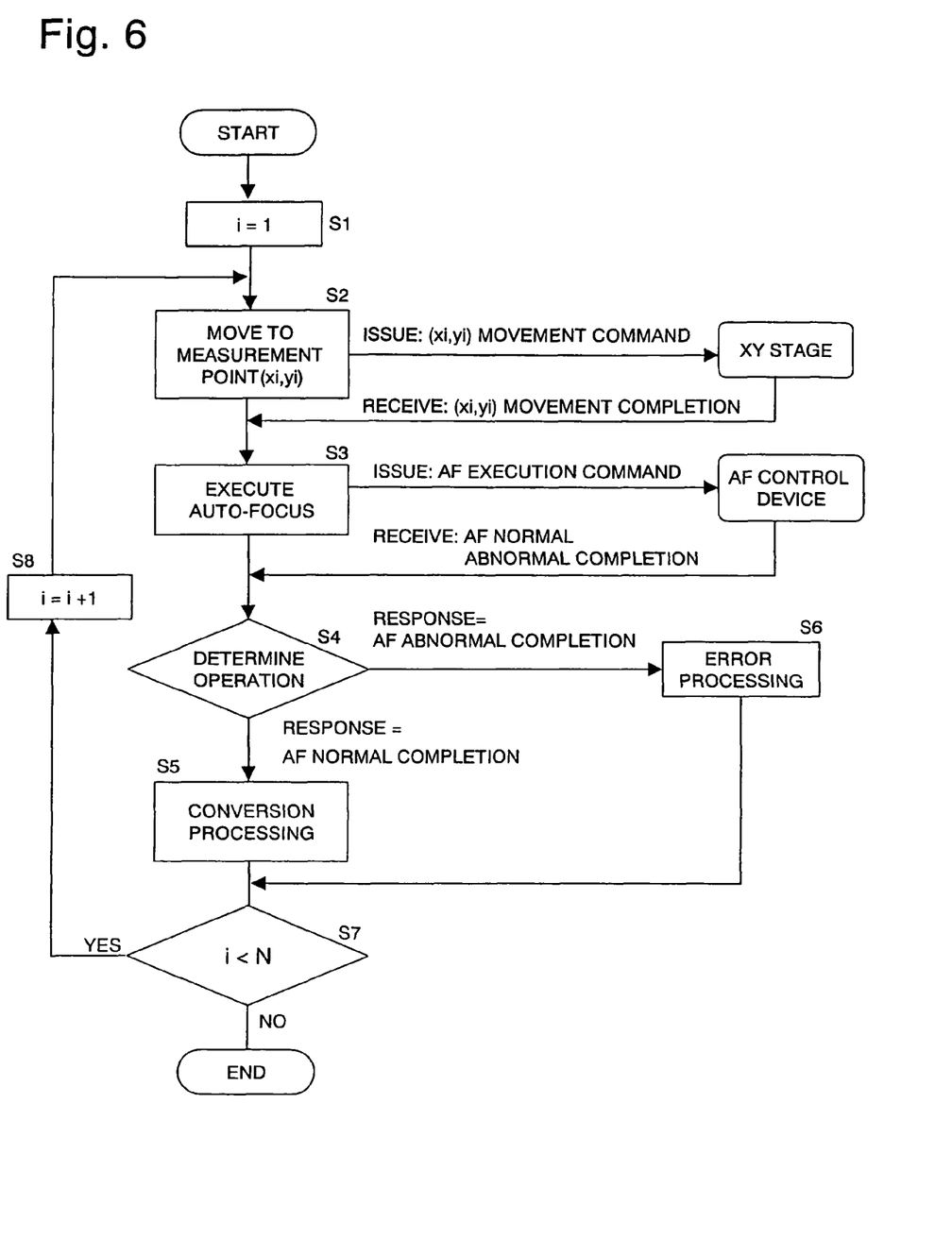
FIG. 6 is a flowchart illustrating a control procedure for creating an auto-focus map in the sample inspection apparatus according to the present invention.

Referring to FIG. 6, a control procedure by the PC device 1 for creating an AF-MAP, will now be described. In this example, it is assumed that the number of measurement points for measuring focus values is N and coordinates (xi, yi) (where i=1, 2, ..., N) of each measurement point has been obtained on the basis of positions of a die pattern which has been set by an operator and then stored, as described with reference to FIG. 3. In addition, it is assumed that the coefficient(s) of the conversion equation (1) (or (2)) has been previously obtained.

After starting the process, the PC device 1 sets "i=1" at Step S1. Then at step S2, a movement command indicating a movement to coordinates $(x_1, y_1)$ is supplied to an XY stage (not shown). When a response signal indicating the completion of the movement is received from the XY stage, the PC device sends an AF execution command to the AF control device 2 to execute the auto-focusing of the optical microscope 3 at Step S3. When a response signal is returned from the AF control device 2, the process goes to Step S4, where it is determined whether the returned response signal represents normal completion indicating that a focus value is normally obtained, or abnormal completion. In the case of the normal completion, the response signal includes the focus value (best focus value) determined by the AF control device 2.

When the response signal represents the normal completion, the process goes from Step S4 to Step S5. The focus value included in the response signal is converted, using the above equation (1) (or (2)), into a voltage value (best focus voltage value) to be applied to the focus lens of the electron beam device 100 and the resultant voltage value is stored as an AF (Auto-Focus) value in an appropriate memory device (not shown). At this time, the AF value is stored in association with the coordinates $(x_1, y_1)$ of the measurement point. When the response signal represents the abnormal completion, the process goes to Step S6, where error processing is performed and information thereof is stored in the memory device in association with the coordinates of the measurement point. In this event, the error processing is executed such that an auto-focusing operation is executed repeatedly at the same position of the sample surface until it is normally completed, or that a focus value obtained for an adjacent measurement point is substituted for a focus value obtained at the time of abnormal completion. When the auto-focusing operation is repeated until it is normally completed, the finally obtained focus value is converted to an AF value (a voltage value) at Step S5.

After storing the AF value into the memory device, the PC device 1 determines at Step S7 whether or not the measurement point $(x_1, y_1)$ for which the AF value has been obtained, is a final measurement point. If not, "i=i+1" is executed at Step S8 and the process returns to Step S2. Therefore, AF values for the measurement points $(x_2, y_2), (x_3, y_3), \ldots, (x_N, y_N)$ are obtained and stored in association with respective coordinates thereof. At Step S7, when it is determined that it is the final measurement point (i=N), the process is ended.

According to the forgoing control, the AF values (voltage values) for all the measurement points are stored to create an AF-MAP. The created AF-MAP is consulted when the sample is inspected for defects and the like. The AF value corresponding to the coordinates of an inspection point on the wafer W is read out. A voltage corresponding to the read AF value is applied to the focus lens of the electron beam device 100.

Figure 7:
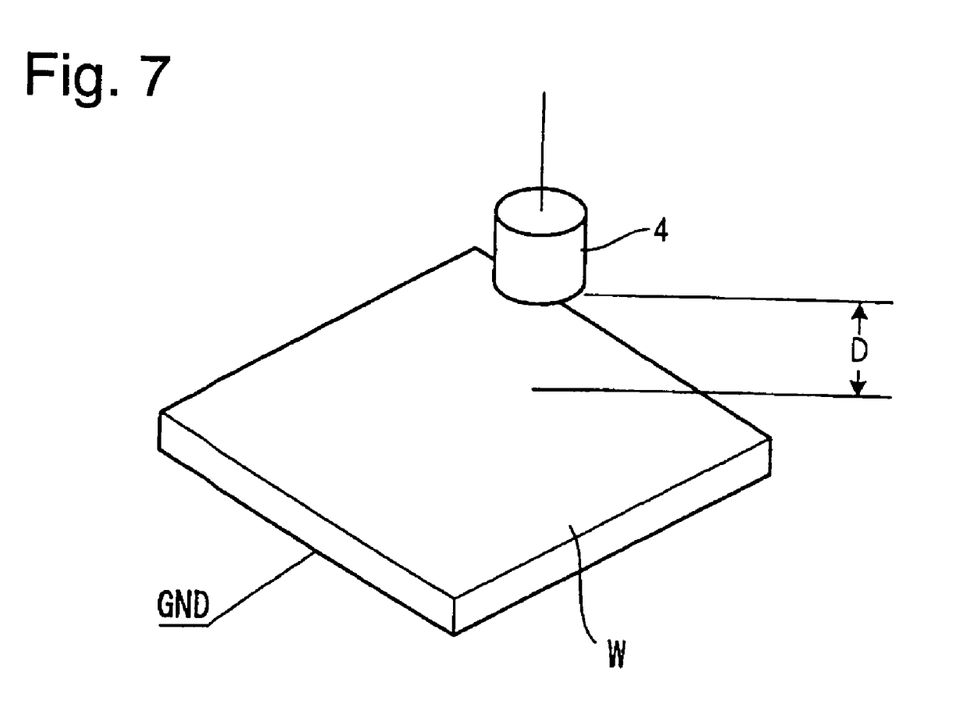
FIG. 7 is an external view illustrating an electrostatic capacitance sensor adaptable to a focus map creation device in a second embodiment of the present invention.

FIG. 7 illustrates an electrostatic capacitance sensor 4 which can be used for a sample inspection apparatus according to another embodiment of the present invention. The electrostatic capacitance sensor 4 detects an electrostatic capacitance formed between a probe and a target object to be measured. The electrostatic capacitance varies depending on variation in distance therebetween.

The electrostatic capacitance sensor 4 is fixed and a stage on which a wafer W is placed is moved to set a measurement position on the wafer to a position directly below the probe of the electrostatic capacitance sensor. Therefore, an electrostatic capacitance value between the wafer at coordinates of the measurement position and the probe of the electrostatic capacitance sensor can be detected and the distance therebetween in Z-axis direction can be calculated on the basis of the measured electrostatic capacitance value. Since there is a linear relationship between the electrostatic capacitance and the distance, when the electrostatic capacitance is converted into the distance using a linear expression, the position on the surface of the wafer W in the Z-axis direction can be detected.

The value in the z-axis direction is converted into the voltage to be applied to the electrostatic lens for focusing of the electron beam device, using the same expression as the above-mentioned expression (1) or (2). The obtained voltage value is stored in association with the coordinates of the measurement position. As a result, the AF-MAP can be created.

It is to be noted that a voltage to be applied to the focus lens of an electron beam device is changed depending on a charge state of a surface of a wafer W. Therefore, when an appropriate surface potential sensor is used instead of an electrostatic capacitance sensor to measure a surface potential of the wafer W and charge information is obtained therefrom, the voltage to be applied to the focus lens, that is, the AF value can be obtained on the basis of the charge information.

The preferred embodiments of the present invention are described in detail. However, it will be obvious to a person skilled in the art that various modifications and changes other than the above-mentioned embodiments are possible.

The invention claimed is:

1. A sample inspection apparatus, comprising:
an electron beam apparatus for irradiating an electron beam on a sample to inspect the sample;
optical focus value detection means including an optical microscope, for detecting a first focus value of the optical microscope which corresponds to a position of a surface of the sample in an optical axis direction; and
converting means for converting the detected first focus value into a second focus value which is used in the electron beam apparatus when the sample is inspected by the electron beam apparatus, wherein
the optical focus value detection means comprises autofocus control means for automatically focusing the optical microscope on the surface of the sample and outputting the first focus value corresponding to a position of a focus lens in the optical axis direction of the optical microscope under a focused condition; and
the converting means comprises means for receiving the first focus value from the auto-focus control means and converting the first focus value into the second focus value such that the second focus value corresponds to a voltage applied to a focus lens of the electron beam apparatus,
wherein when a first focus value $ZM_n$ regarding a point of the sample surface is obtained, the converting means is adapted to calculate the following equation, using a previously obtained first focus value $ZM_1$ regarding another point of the sample surface and a previously obtained voltage $ZEB_1$ to be supplied to the focus lens of the electron beam apparatus regarding the latter point of the sample surface, to obtain a voltage $ZEB_n$ to be applied to the focus lens of the electron beam apparatus regarding the former point:

$$ZEB_n = ZM_n * a$$

where "a"=$(ZEB_1/ZM_1)$.

2. A sample inspection apparatus, comprising:
an electron beam apparatus for irradiating an electron beam on a sample to inspect the sample;
optical focus value detection means including an optical microscope, for detecting a first focus value of the optical microscope which corresponds to a position of a surface of the sample in an optical axis direction; and
converting means for converting the detected first focus value into a second focus value which is used in the electron beam apparatus when the sample is inspected by the electron beam apparatus, wherein
the optical focus value detection means comprises autofocus control means for automatically focusing the optical microscope on the surface of the sample and outputting the first focus value corresponding to a position of a focus lens in the optical axis direction of the optical microscope under a focused condition; and
the converting means comprises means for receiving the first focus value from the auto-focus control means and converting the first focus value into the second focus value such that the second focus value corresponds to a voltage applied to a focus lens of the electron beam apparatus,
wherein when a first focus value $ZM_n$ regarding a point of the sample surface is obtained, the converting means is adapted to calculate the following equation, using previously obtained first focus values $ZM_1$ and $ZM_2$ regarding two points of the sample surface and previously obtained voltages $ZEB_1$ and $ZEB_2$ to be supplied to the focus lens of the electron beam apparatus regarding the latter points of the sample surface, to obtain a voltage $ZEB_n$ to be applied to the focus lens of the electron beam apparatus regarding the former point:

$$ZEB_n = a * ZM_n + b$$

where $a = (ZEB_1 - ZEB_2)/(ZM_1 - ZM_2)$
$b = ZEB_1 - (ZM_1 * a)$.

3. A sample inspection apparatus, comprising:
an electron beam apparatus for irradiating an electron beam on a sample to inspect the sample;
optical focus value detection means including an optical microscope, for detecting a first focus value of the optical microscope which corresponds to a position of a surface of the sample in an optical axis direction; and converting means for converting the detected first focus value into a second focus value which is used in the electron beam apparatus when the sample is inspected by the electron beam apparatus, wherein the optical focus value detection means comprises auto-focus control means for automatically focusing the optical microscope on the surface of the sample and outputting the first focus value corresponding to a position of a focus lens in the optical axis direction of the optical microscope under a focused condition; and the converting means comprises means for receiving the first focus value from the auto-focus control means and converting the first focus value into the second focus value such that the second focus value corresponds to a voltage applied to a focus lens of the electron beam apparatus, wherein the conversion means is adapted to obtain a voltage ZEB to be supplied to the focus lens of the electron beam apparatus regarding a point of the sample surface, by expressing the voltage ZEB as a polynomial of a focus value ZM regarding the point, and solving a hyper-complex polynomial using previously obtained focus values regarding other points of the sample surface and previously obtained voltages to be supplied to the focus lens of the electron beam apparatus regarding the latter points, to calculate coefficients of the polynomial.

* * * * *